US012593461B2

(12) United States Patent
Steigerwald et al.

(10) Patent No.: US 12,593,461 B2
(45) Date of Patent: Mar. 31, 2026

(54) HIGH FREQUENCY HETEROJUNCTION BIPOLAR TRANSISTOR DEVICES

(71) Applicant: Analog Devices, Inc., Wilmington, MA (US)

(72) Inventors: F. Jacob Steigerwald, North Andover, MA (US); James G. Fiorenza, Carlisle, MA (US); Guanghai Ding, Bedford, MA (US); Susan L. Feindt, Andover, MA (US); Pengfei Wu, Westford, MA (US); Clifford Alan King, Gloucester, MA (US)

(73) Assignee: Analog Devices, Inc., Wilmington, MA (US)

( * ) Notice: Subject to any disclaimer, the term of this patent is extended or adjusted under 35 U.S.C. 154(b) by 377 days.

(21) Appl. No.: 18/204,095

(22) Filed: May 31, 2023

(65) Prior Publication Data

US 2024/0405105 A1    Dec. 5, 2024

(51) Int. Cl.
| | |
|---|---|
| *H10D 10/80* | (2025.01) |
| *H10D 10/01* | (2025.01) |
| *H10D 62/822* | (2025.01) |
| *H10D 62/824* | (2025.01) |
| *H10D 86/00* | (2025.01) |
| *H10D 86/01* | (2025.01) |

(52) U.S. Cl.
CPC ........... *H10D 10/80* (2025.01); *H10D 10/021* (2025.01); *H10D 62/822* (2025.01); *H10D 62/824* (2025.01); *H10D 86/01* (2025.01); *H10D 86/201* (2025.01)

(58) Field of Classification Search
CPC .... H10D 10/80; H10D 10/021; H10D 62/822; H10D 62/824; H10D 86/01; H10D 86/201; H10D 10/60; H10D 10/311; H10D 62/134; H10D 64/281
See application file for complete search history.

(56) References Cited

U.S. PATENT DOCUMENTS

| | | | |
|---|---|---|---|
| 9,059,016 B1 | 6/2015 | Hekmatshoar-Tabari et al. | |
| 2016/0064484 A1 | 3/2016 | Harame et al. | |
| 2016/0300935 A1 | 10/2016 | Cai et al. | |
| 2016/0380087 A1 | 12/2016 | Liu | |
| 2017/0040219 A1* | 2/2017 | Chang ................. | H10D 84/038 |

(Continued)

OTHER PUBLICATIONS

"European Application Serial No. 24175033.0, Extended European Search Report mailed Oct. 1, 2024", 11 pgs.

(Continued)

*Primary Examiner* — Syed I Gheyas
(74) *Attorney, Agent, or Firm* — Schwegman Lundberg & Woessner, P.A.

(57) ABSTRACT

Techniques of integrating lateral HBT devices into a silicon on insulator (SOI) CMOS process. Similar approaches could also be applied to Fin Field-Effect Transistors (FinFETs). A first technique makes use of a CMOS replacement gate process that is typically associated with a partially depleted SOI (PDSOI) or fully depleted SOI (FDSOI) process. A second technique is independent of the CMOS process. Both techniques can accommodate silicon germanium (SiGe) and/or III-V materials, include a self-aligned base contact, and can be used to construct both NPN and PNP transistors with varied peak fT and breakdown voltages.

22 Claims, 11 Drawing Sheets

(56)            References Cited

U.S. PATENT DOCUMENTS

| | | | | |
|---|---|---|---|---|
| 2019/0296131 A1* | 9/2019 | Kim | ..................... | H10D 62/812 |
| 2023/0058451 A1* | 2/2023 | Jain | ..................... | H10D 86/201 |

OTHER PUBLICATIONS

"European Application Serial No. 24175033.0, Response filed May 8, 2025 to Extended European Search Report mailed Oct. 1, 2024", 17 pgs.

* cited by examiner

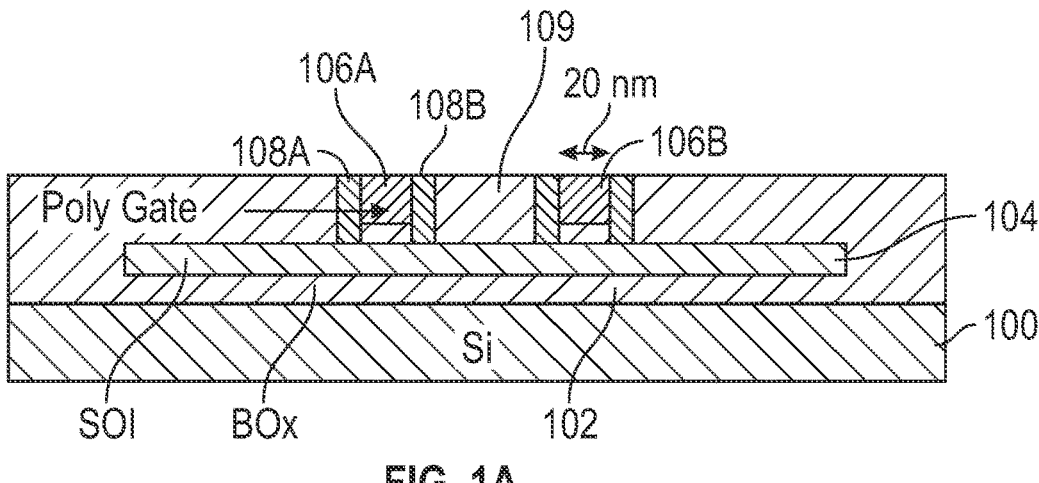
FIG. 1A
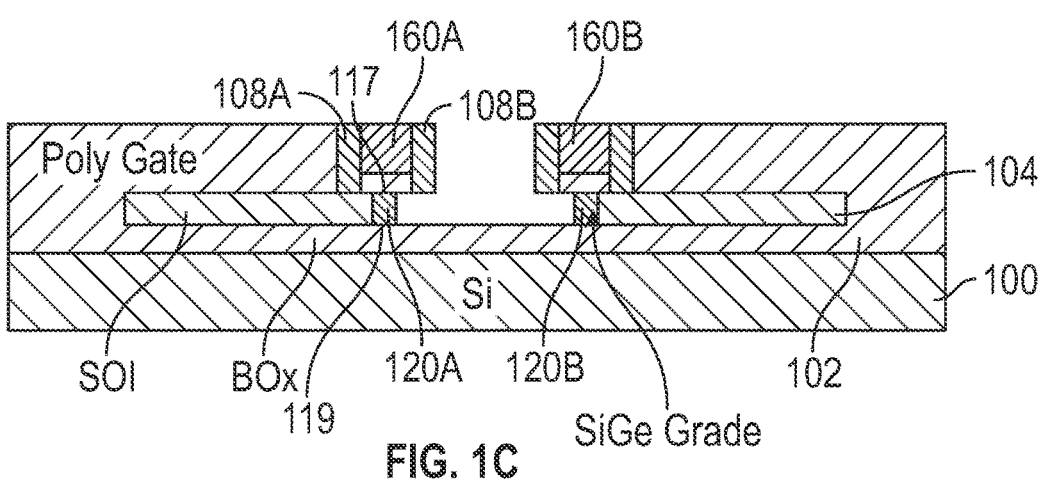
FIG. 1B
FIG. 1C

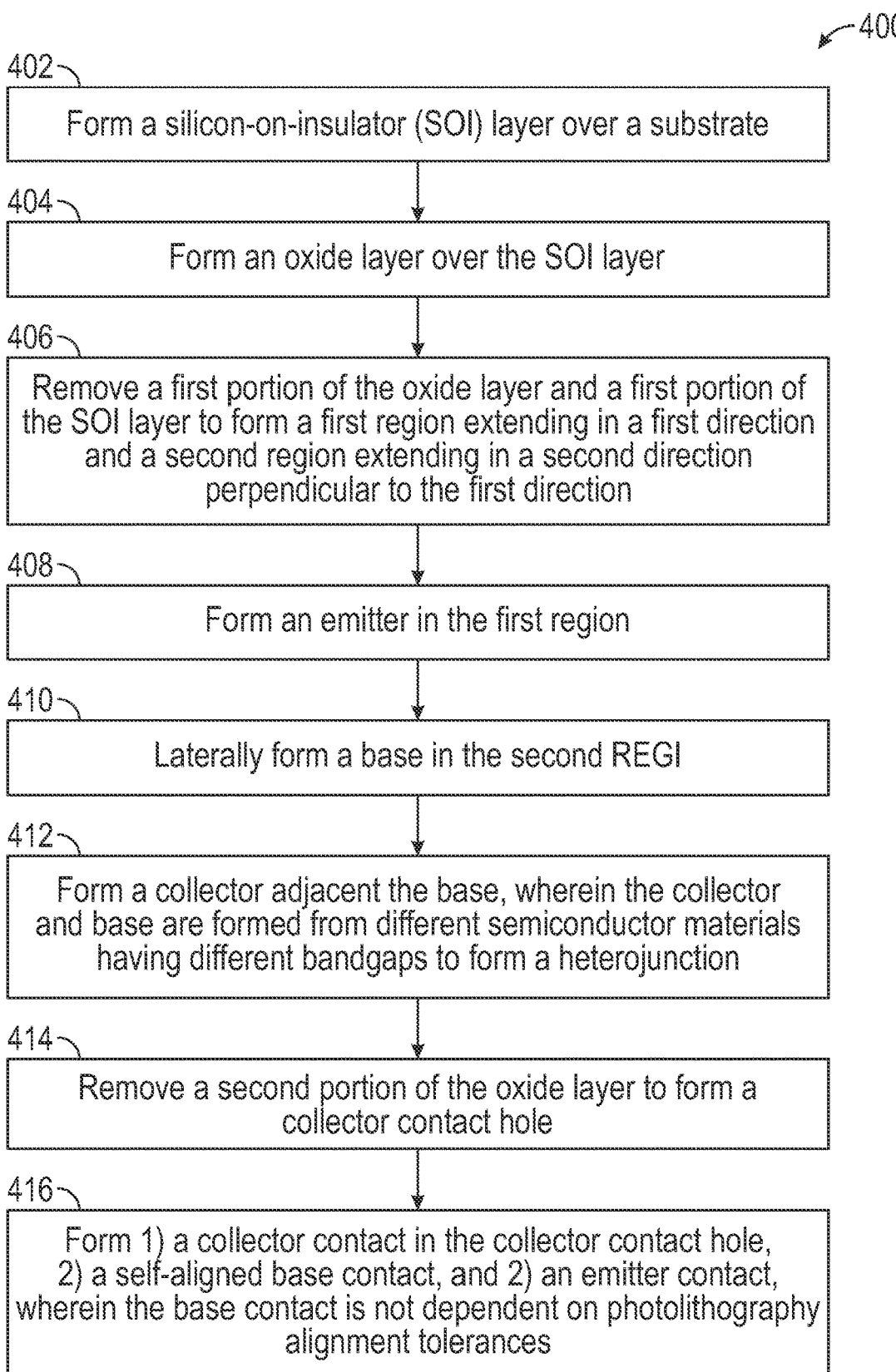

400

402

Form a silicon-on-insulator (SOI) layer over a substrate

404

Form an oxide layer over the SOI layer

406

Remove a first portion of the oxide layer and a first portion of the SOI layer to form a first region extending in a first direction and a second region extending in a second direction perpendicular to the first direction

408

Form an emitter in the first region

410

Laterally form a base in the second REGI

412

Form a collector adjacent the base, wherein the collector and base are formed from different semiconductor materials having different bandgaps to form a heterojunction

414

Remove a second portion of the oxide layer to form a collector contact hole

416

Form 1) a collector contact in the collector contact hole, 2) a self-aligned base contact, and 2) an emitter contact, wherein the base contact is not dependent on photolithography alignment tolerances

FIG. 4

HIGH FREQUENCY HETEROJUNCTION BIPOLAR TRANSISTOR DEVICES

FIELD OF THE DISCLOSURE

This document pertains generally, but not by way of limitation, to semiconductor devices, and more particularly, to techniques for constructing bipolar transistor devices.

BACKGROUND

Constructing bipolar transistor devices involves a meticulous process that combines semiconductor materials, precise doping techniques, and intricate patterning. The fabrication begins by selecting a suitable substrate, often made of silicon, onto which a thin layer of oxide is grown to serve as an insulating layer. The next step involves depositing different semiconductor layers, such as the doped base stack and the heavily doped emitter regions, using techniques like chemical vapor deposition to achieve epitaxial growth. These layers are carefully patterned through lithography, etching and selective epitaxy, creating the desired transistor structure. The process continues with the addition of contacts and metallization layers to establish electrical connections to the various regions of the transistor. Finally, a passivation layer is applied to protect the device and ensure long-term stability.

SUMMARY OF THE DISCLOSURE

This disclosure describes two techniques of integrating lateral HBT devices into a silicon on insulator (SOI) CMOS process. Similar approaches could also be applied to Fin Field-Effect Transistors (FinFETs). The first technique (FIGS. 1A-1I) makes use of a CMOS replacement gate process that is typically associated with a partially depleted SOI (PDSOI) or fully depleted SOI (FDSOI) process. The second technique (FIGS. 3A-3P) is independent of the CMOS process. Both techniques can accommodate silicon germanium (SiGe) and/or III-V materials, include a self-aligned base contact, and can be used to construct both NPN and PNP transistors with varied peak fT and breakdown voltages.

In some aspects, this disclosure is directed to a lateral heterojunction bipolar transistor device comprising: a silicon-on-insulator (SOI) layer formed over a substrate; an oxide layer formed over the SOI layer; a laterally formed base in a first region extending in a first direction; a self-aligned base contact coupled to the base, wherein the base contact is not dependent on photolithography alignment tolerances; an emitter formed in a second region extending in a second direction perpendicular to the first direction; and a collector formed adjacent the base, wherein the collector and base are formed from different semiconductor materials having different bandgaps to form a heterojunction.

In some aspects, this disclosure is directed to a method for fabricating a lateral heterojunction bipolar transistor device, the method comprising: forming a silicon-on-insulator (SOI) layer over a substrate; forming an oxide layer over the SOI layer; removing a first portion of the oxide layer and a first portion of the SOI layer to form a first region extending in a first direction and a second region extending in a second direction perpendicular to the first direction; forming an emitter in the first region; laterally forming a base in the second region; forming a collector adjacent the base, wherein the collector and base are formed from different semiconductor materials having different bandgaps to form a heterojunction; removing a second portion of the oxide layer to form a collector contact hole; and forming 1) a collector contact in the collector contact hole, 2) a self-aligned base contact, and 2) an emitter contact, wherein the base contact is not dependent on photolithography alignment tolerances.

In some aspects, this disclosure is directed to a lateral heterojunction bipolar transistor device comprising: a silicon-on-insulator (SOI) layer formed over a substrate; an oxide layer formed over the SOI layer; a laterally formed base in a first region extending in a first direction; a self-aligned base contact coupled to the base, and wherein the base includes a semiconductor material with a bandgap less than silicon; and an emitter formed in a second region extending in a second direction perpendicular to the first direction; and a collector formed adjacent the base, wherein the collector and base are formed from different semiconductor materials having different bandgaps to form a heterojunction.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIGS. 1A-1I depict an example of a process flow for fabricating a lateral heterojunction bipolar transistor device, in accordance with this disclosure.

FIG. 4 is a flow diagram of an example of a method for fabricating a lateral heterojunction bipolar transistor device.

DETAILED DESCRIPTION

Figure 1D:
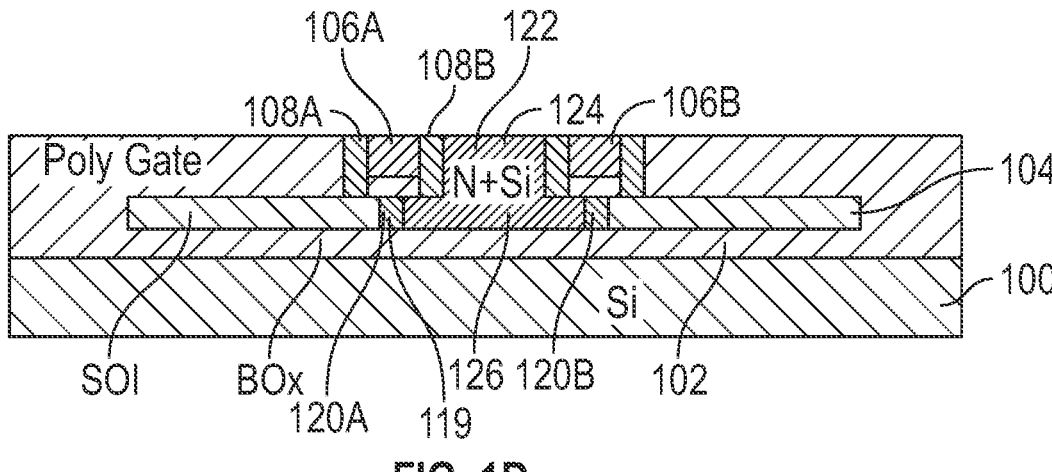

A conventional bipolar transistor uses a homojunction (junction between the same material) between the base and emitter regions. A heterojunction bipolar transistor (HBT) is a type of bipolar transistor in which one or both the emitter and collector junctions use different semiconductor materials having different bandgaps to form a heterojunction.

One important aspect of using HBTs is the ability to achieve higher performance characteristics compared to traditional bipolar transistors. Heterojunctions allow for better control of carrier injection and transport, reducing certain limitations encountered in homojunction devices. By using different semiconductor materials with varying bandgaps, the HBT can enhance the transistor's current gain, power efficiency, and frequency response.

HBTs find application in high-speed digital circuits, wireless communication systems, microwave amplifiers, automatic test equipment, optoelectronics, and other fields where high-frequency operation and performance are essential. The integration of heterojunctions in the transistor structure enables improved device characteristics, making HBTs a valuable technology in advanced semiconductor devices.

Heterojunction bipolar transistor (HBT) devices are needed to enable the transition frequency (fT) and maximum frequency (fMax) above 50 GHz. Multiple device architectures exist for vertical HBT structures. For integration with CMOS processes, all of these device architectures require many additional process steps that impact cycle time and product yield.

The present inventors have recognized a need for CMOS integration of lateral HBTs to enable high frequency operation of fT and fMax, such as to nearly 1 terahertz (THz). This disclosure describes various techniques that overcome the difficulty in contacting the narrow base width of the HBT, where the narrow base width is needed for high frequency operation, by providing a self-aligned base contact.

This disclosure describes two techniques of integrating lateral HBT devices into a silicon on insulator (SOI) CMOS process. Similar approaches could also be applied to Fin Field-Effect Transistors (FinFETs). The first technique (FIGS. 1A-1I) makes use of a CMOS replacement gate process that is typically associated with a partially depleted SOI (PDSOI) or fully depleted SOI (FDSOI) process. The second technique (FIGS. 3A-3P) is independent of the CMOS process. Both techniques can accommodate silicon germanium (SiGe) and/or III-V materials, include a self-aligned base contact, and can be used to construct both NPN and PNP transistors with varied peak fT and breakdown voltages.

A III-V material refers to compounds composed of elements from Group III (such as gallium, indium, and aluminum) and Group V (such as nitrogen, phosphorus, and arsenic) of the periodic table. III-V semiconductors provide superior electron mobility, which enables the construction of high-speed transistors and high-frequency devices. Additionally, III-V materials offer a wide range of bandgaps that can used in bandgap engineering.

FIGS. 1A-1I depict an example of a process flow for fabricating a lateral heterojunction bipolar transistor device, in accordance with this disclosure. To form a lateral HBT capable of high frequency operation of fT and fMax at 1 THz, a sub-50 nanometer (nm) CMOS process can be used. Larger geometry SOI CMOS processes can be used for circuits designed to operate with more mature CMOS nodes. Various techniques of this disclosure take advantage of the PDSOI, FDSOI, or Fin Field-Effect Transistor (FinFET) lithography capabilities to fabricate bipolar transistor devices.

As described in detail below, FIGS. 1A-1I depict the fabrication of a high-performance lateral silicon germanium (SiGe) HBT using a four-mask adder CMOS process. The process can use SiGe epitaxy to implement a laterally graded SiGe base profile to increase fT and fMax. In the example shown, the structure can start with two replacement (or dummy) gates and a hole can be etched between the replacement gates down to the SOI. A cavity can be formed in the silicon (Si) with xenon difluoride ($XeF_2$). A laterally graded epi structure is grown starting at the distal ends of the cavity and merging in the quasi-neutral n+ emitter. The replacement gates are then etched out and self-aligned base contacts are formed using inside spacers followed by filling and patterning p+ polysilicon.

The structure shown in FIG. 1A includes a substrate 100, such as silicon. A buried oxide (BOX) layer 102 is formed over the substrate 100. A silicon-on-insulator (SOI) layer 104 is formed over the substrate 100. Using the CMOS process, a first replacement gate 106A and a second replacement gate 106B are patterned, e.g., poly gates. Nitride spacers 108A and 108B are formed on both sides of the first replacement gate 106A. Simultaneously, similar nitride spacers are formed on both sides of the second replacement gate 106B.

In FIG. 1B, following the replacement gate patterning of FIG. 1A and chemical mechanical polishing (CMP) of the metal gates, a resist layer 110 is applied and a first bipolar mask is added to remove the oxide layer 109 between the first replacement gate 106A and the second replacement gate 106B to produce an SOI cavity 112. For example, a dry etch, such as an anisotropic or directional etch for silicon dioxide, can be performed followed by an isotropic dry etch for silicon. The etching removes a portion of the oxide layer 109 and a portion of the SOI layer 104. Importantly, the etching removes material and forms a lateral region 114A (a first isotropic undercut region) under the first replacement gate 106A and a lateral region 114B (a second isotropic undercut region) under the second replacement gate 106B.

In the symmetrical example shown in FIG. 1B, the etching forms a T-shaped region. In configurations that are not symmetrical, such as where only one base and one collector are formed, the etching forms an L-shaped region (half of the T-shape) or a mirror image of the L-shape. More generally, the etching forms the region 112 extending in a first direction 116 and the lateral region 114A (and, if present the lateral region 114B) extending in a second direction 118 that is generally perpendicular to the first direction 116. The lateral regions 114A, 114B undercut (e.g., extend under) a portion of at least one layer, such as a portion of the first replacement gate 106A and the second replacement gate 106B.

In FIG. 1C, a first base 120A and a second base 120B are laterally formed in the lateral region 114A of FIG. 1B and the lateral region 114B of FIG. 1B, respectively. More particularly, and in accordance with this disclosure, a layer of semiconductor material with a bandgap less than the material used to form the emitter can be laterally grown to form the first base 120A and the second base 120B. This base formation is in contrast to other techniques in which the base is grown upward off the silicon. By laterally growing the first base 120A and the second base 120B, the bases can be very small, such as less than 20 nm, which allows the device to operate at such high speeds, such as 1 THz. In some examples, the first base 120A (and, if present, the second base 120B), can be formed so as to include a first portion 117 (the left portion of the base 120A), having a first doping concentration and a second portion 119 (the right portion of the first base 120A) having a second doping concentration.

A non-limiting list of examples of semiconductor materials with a bandgap less than a silicon emitter that can be used to form the base include silicon germanium ($Si_{1-x}Ge_x$), germanium tin ($Ge_{1-x}Sn_x$), and some alloys of silicon tin ($Si_{1-x}Sn_x$) and silicon germanium tin ($Si_{1-x-y}Ge_xSn_y$) where x and y are the mole fractions of the constituent elements. For III-V HBTs consisting of an InP emitter, the non-limiting list of materials for the base include, indium gallium arsenide ($In_xGa_yAs_{1-x-y}$), indium gallium phosphide ($In_xGa_yP_{1-x-y}$), and gallium arsenic antimonide $Ga_{1-x-y}As_xSb_y$. In some examples, it can be desirable to grade the layer of semiconductor material (with a bandgap less than the emitter material) that is laterally grown to form the first base 120A and the second base 120B. For example, the grading of $Si_{1-x}Ge_x$ can be such that the Ge concentration is highest at the collector near the beginning of growth and lowest at the emitter side. Grading can generate a built-in quasi-electric field, but only in the minority carrier band, which can accelerate minority carriers as they transit the base. In examples that include germanium, the composition of germanium can be varied as it is grown, such as between 10-30% germanium. In some examples, less than 1% carbon can be added to control the diffusion of dopants.

In FIG. 1D, an emitter 122 is formed in the first region 112 of FIG. 1C. For example, the emitter 122 can be formed by epitaxial growth of the emitter, e.g., an n+ emitter for an NPN transistor device. The emitter 122 can be formed so as to include a first portion 124 (the top portion of the emitter 122), having a first doping concentration and a second portion 126 (the bottom portion of the emitter 122) having a second doping concentration.

Figure 1E:
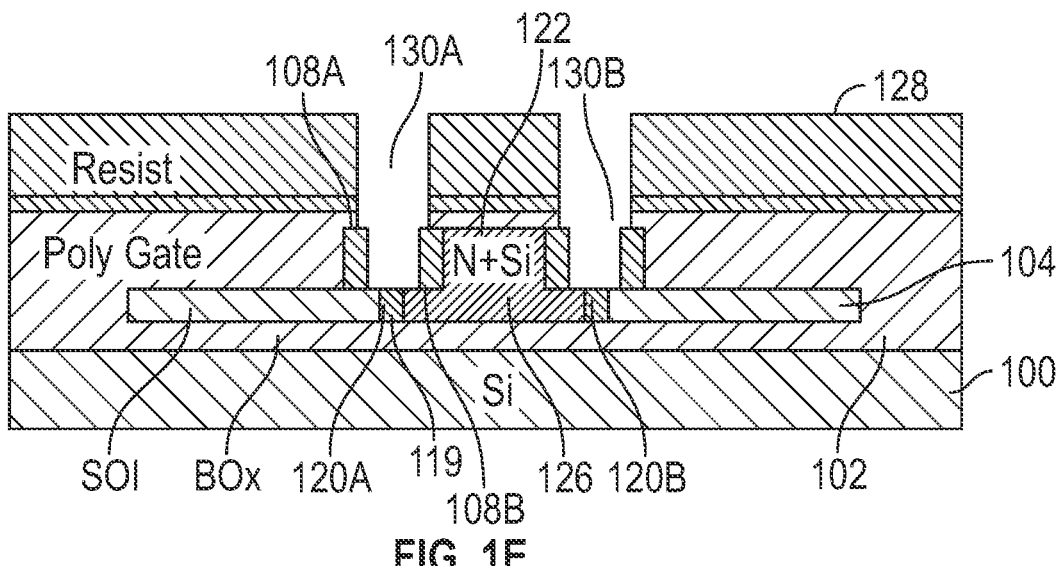

In FIG. 1E, a layer 128 of resist is applied and etching can remove the poly of the first replacement gate 106A and the second replacement gate 106B to form corresponding cavities 130A and 130B. Contacts can then be formed in the cavities 130A, 130B, which can be electrically coupled to the first base 120A and the second base 120B.

Figure 1F:
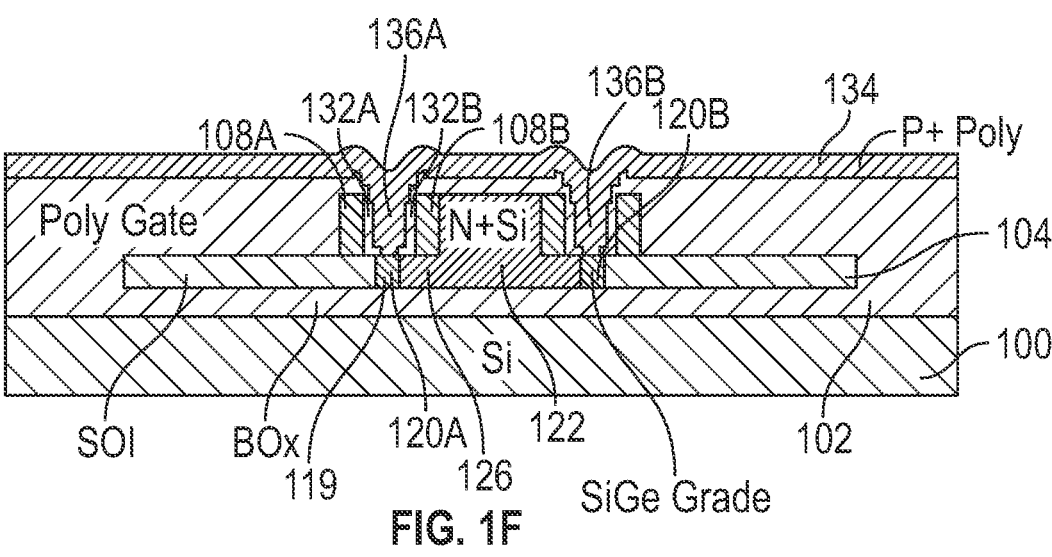

In FIG. 1F, oxide inside spacers 132A, 132B are formed adjacent the nitride spacers 108A, 108B, respectively. If the second base 120B is present, similar oxide inside spacers can be formed adjacent the nitride spacers formed over the second base 120B. The replacement gate nitride spacers 108A, 108B and the oxide inside spacers 132A, 132B reduce the alignment requirement of the second mask, which is used to remove the replacement gates. The reduction in the alignment requirement assists in the formation of self-aligning base contacts, as described below.

After forming the oxide inside spacers 132A, 132B, a base poly layer 134, e.g., p+ poly, is deposited, including into the cavities 130A, 130B of FIG. 1E, to form a first base contact 136A to electrically couple to the first base 120A and a second base contact 136B to electrically couple to the second base 120B. The first base contact 136A and the second base contact 136B are self-aligned base contacts. The first base contact 136A and the second base contact 136B are not dependent on photolithography alignment tolerances. The techniques shown here utilize the nitride spacers 108A, 108B and oxide inside spacers 132A, 132B, for example, to provide self-alignment of the base contacts. There is a freedom to where the resist layer 128 of FIG. 1E goes because only one material is etched away selectively in FIG. 1E to form the cavities 130A, 130B, with different materials forming their boundaries.

Figure 1G:
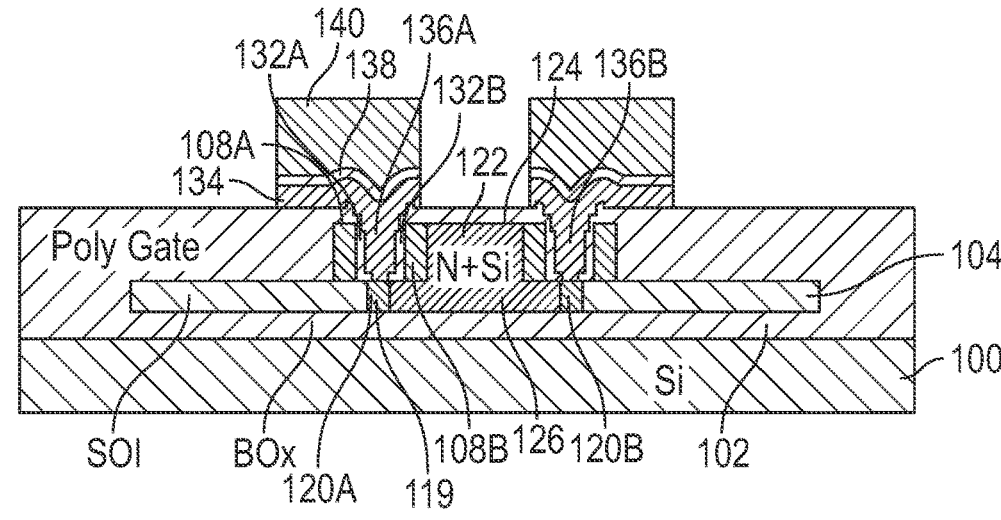

In FIG. 1G, the base poly layer 134 is capped with an oxide layer 138. Then, a layer 140 of resist is added to pattern and remove some of the base poly layer 134 and the oxide layer 138, including above the emitter 122.

Figure 1H:
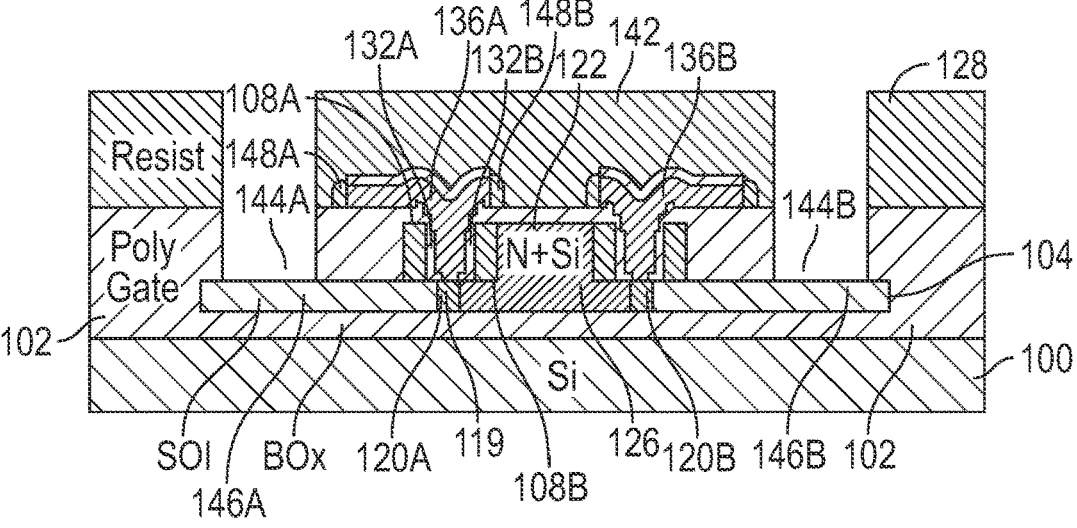

In FIG. 1H, a layer 142 of resist is added and a fourth mask is used to form cavities 144A, 144B, which are used to form collector contacts to electrically couple to corresponding collectors 146A, 146B. Etching, for example, can remove a portion of the oxide layer 109 to form a collector contact. Nitride spacers 148A, 148B are formed on the base poly adjacent to the base contact 136A to enable the self-aligned emitter contact.

Figure 1I:
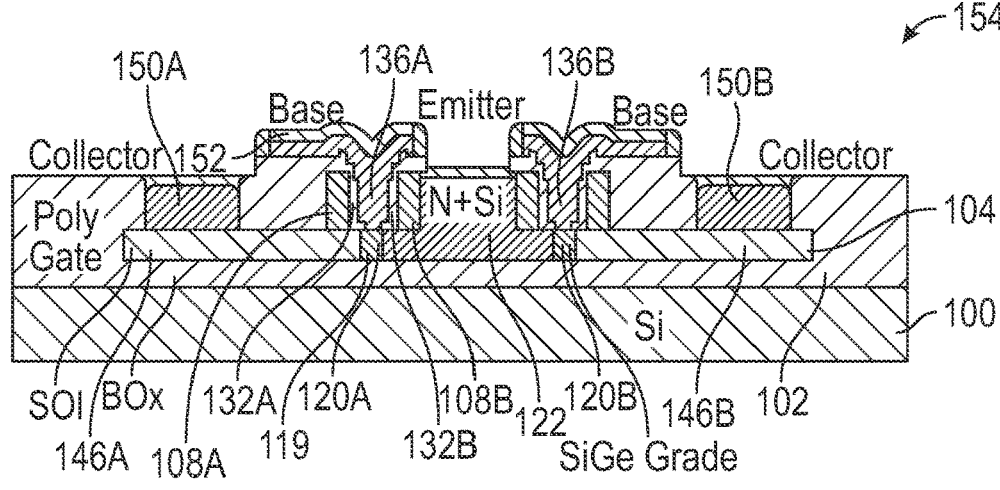

In FIG. 1I, collector contacts 150A, 150B are formed. These collector contact regions can be combined with the MOS source/drain construction. In addition, a layer 152 of silicide, e.g., nickel silicide, is formed over the base, emitter, and collector contacts, thereby forming an HBT 154.

In an HBT, one or both the emitter-base and collector-base junctions can be heterojunctions. In FIG. 1I, a heterojunction is formed between a collector, such as the collector 146A, and its corresponding base, such as the first base 120A. The presence of a larger bandgap material in the collector increases the breakdown voltage of the transistor and therefore provides a wider application space. Also in FIG. 1I, a heterojunction is formed between a base, such as base 120A, and the emitter 122. This heterojunction exponentially improves the injection efficiency of the transistor allowing the base doping to be increased while still achieving high current gain. High base doping is important to lower base resistance, reduce thermal noise and increase $f_{max}$. High base doping also allows the base width to be decreased leading to an increase in $f_T$ through a lower base transit time.

The configuration shown in FIG. 1I is a symmetrical configuration with two collectors and two bases sharing a common emitter that forms a single HBT. The symmetrical configuration shown can provide control of defects as the emitter epitaxial growth fronts from each side coalesce. The techniques of this disclosure are not limited to symmetrical configurations, however. Other configurations include a single collector, a single base, and a single emitter, such as if a line was drawn through the emitter 122 and structure on only one side of the line was used to form the HBT.

Figure 2:
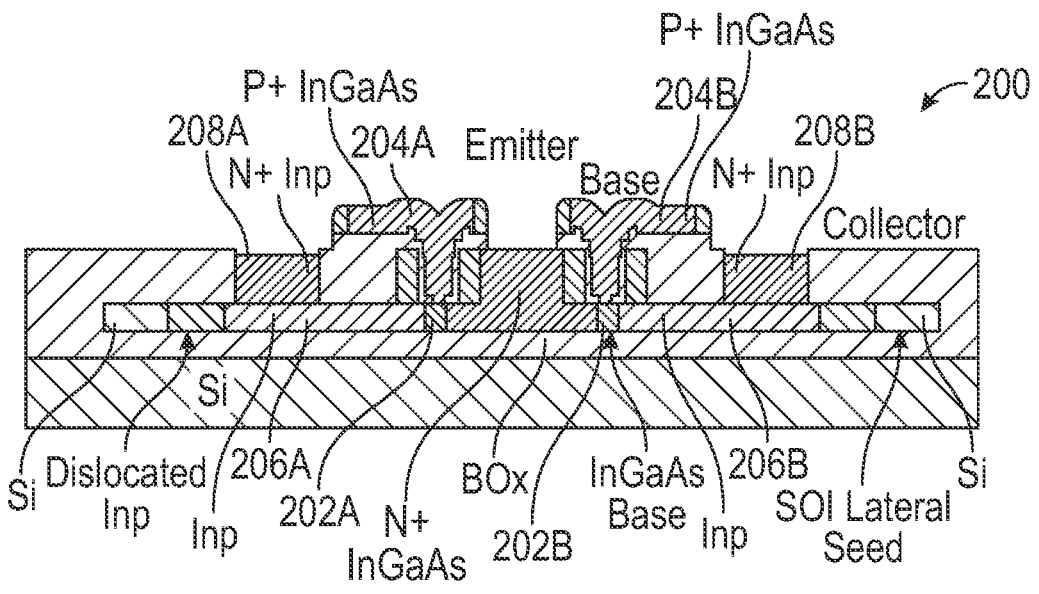
FIG. 2 depicts a cross-sectional view of another example of a lateral heterojunction bipolar transistor device, in accordance with this disclosure.

FIG. 2 depicts a cross-sectional view of another example of a lateral heterojunction bipolar transistor device, in accordance with this disclosure. The HBT 200 of FIG. 2 uses InP and InGaAs epitaxy instead of Si and SiGe epitaxy of FIGS. 1A-1I for enhanced electron mobility. Like in FIGS. 1A-1I, the first base 202A and the second base 202B are laterally grown and the first base contact 204A and the second base contact 204B are self-aligned. The process used to form the III-V HBT 200 of FIG. 2 is similar to what was described above with respect to FIGS. 1A-1I and, for brevity, will not be described in detail again.

A heterojunction can be formed between a collector and its corresponding base, such as between the first collector 206A and the first base 202A and, if present, between the second collector 206B and the second base 202B. For example, the first base 202A can include InGaAs and the collector 206A can include InP. The collectors 206A, 206B can be lightly doped. In some examples, the collectors can be grown. Collector contacts 208A, 208B can be n+ InP. A layer of p+ InGaAs can be used to form the self-aligned base contacts 204A, 204B.

InP/InGaAs epitaxy may be used in place of Si/SiGe epitaxy for an electron mobility enhancement (InGaAs electron mobility is greater than 5× that of silicon). The SOI layer is further recessed beyond the collector to leave more room to grow epitaxy from the Si seed to the collector, thus enabling the dislocations formed by the lattice mismatched InP growth on silicon to be reduced by "epitaxial necking" in which the threading dislocations are driven to the tunnel sidewall.

Figure 3A:
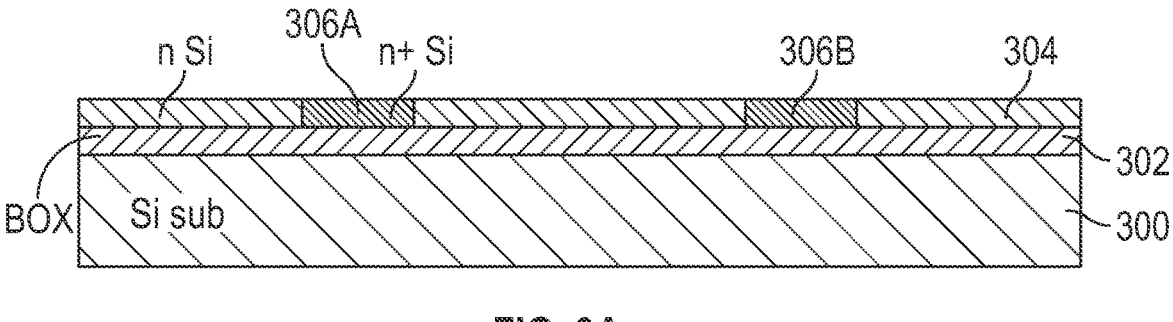
FIGS. 3A-3P depict another example of a process flow for fabricating a lateral heterojunction bipolar transistor device, in accordance with this disclosure.
Figure 3B:
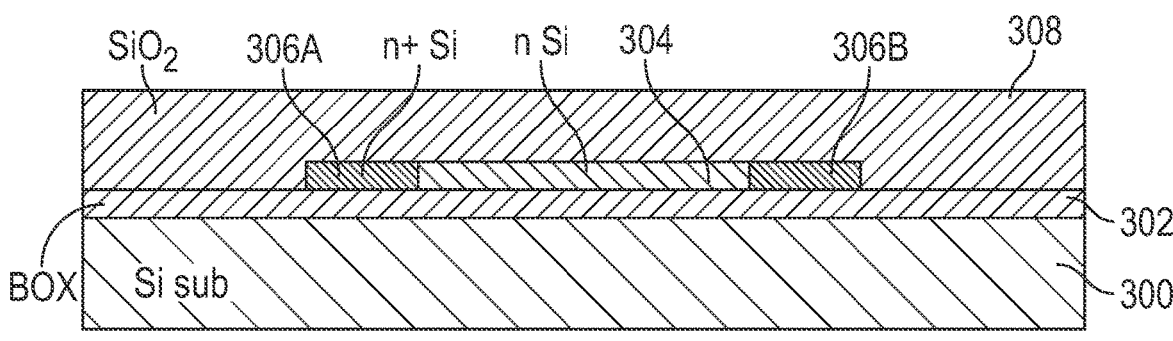
Figure 3C:
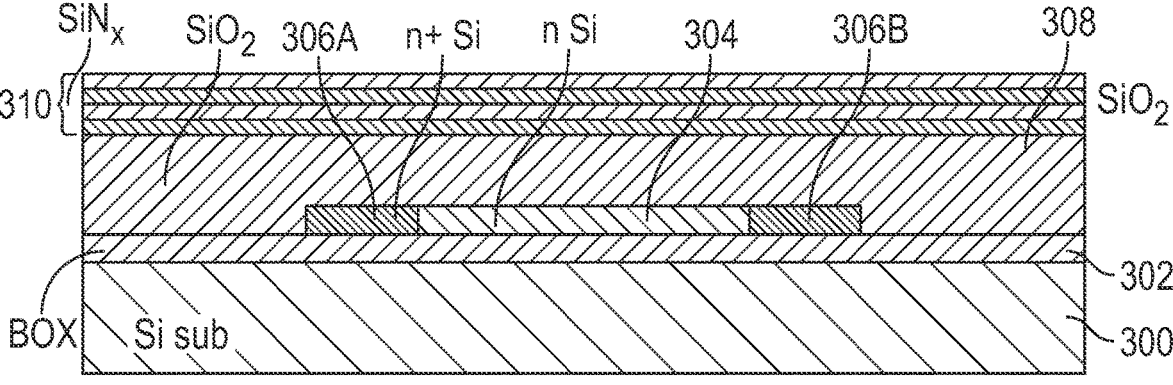
Figure 3D:
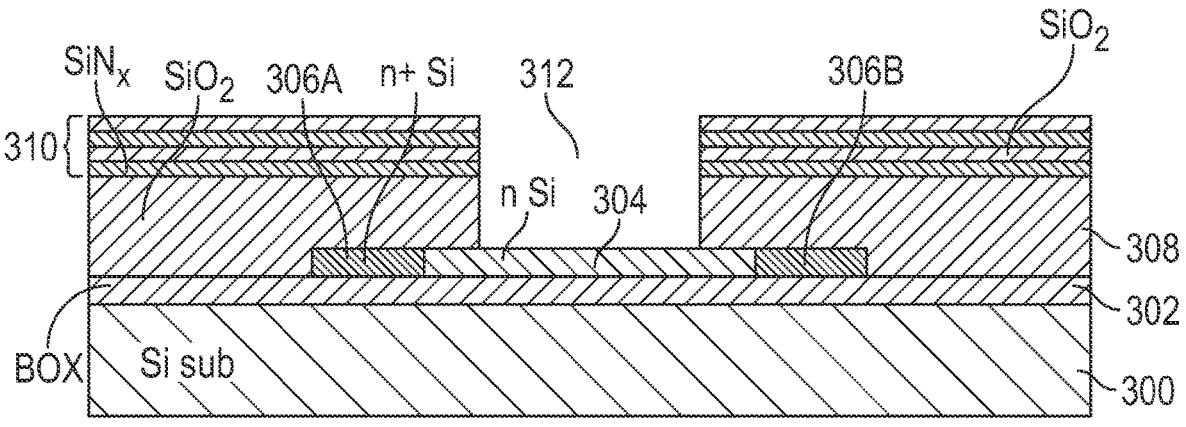
Figure 3E:
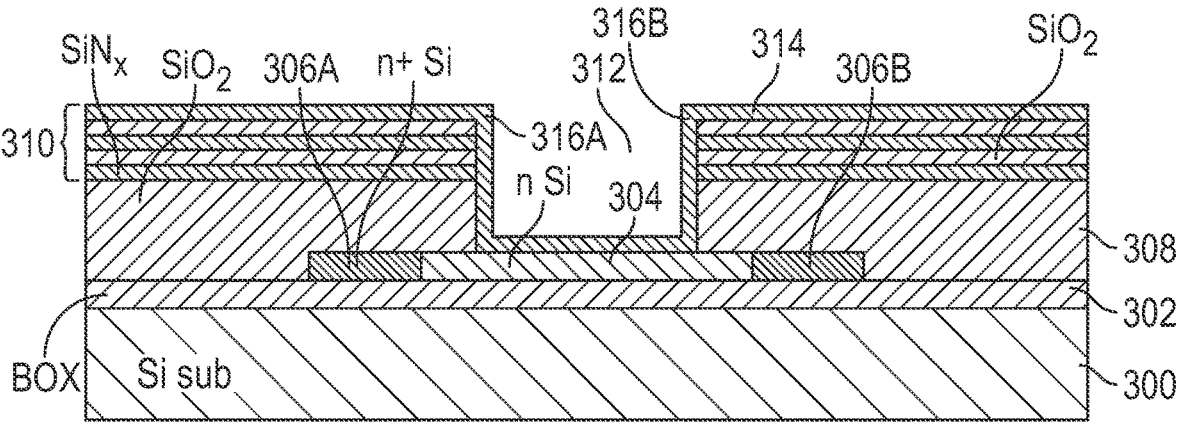
Figure 3F:
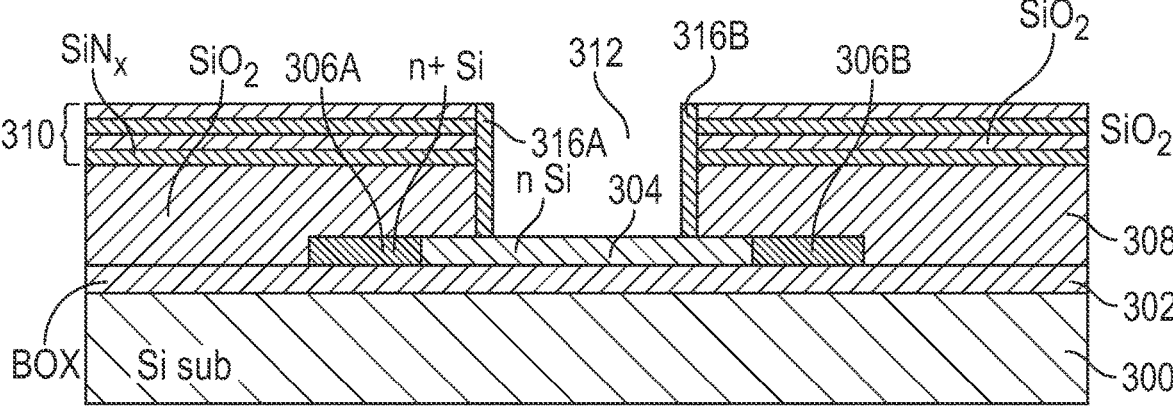
Figure 3G:
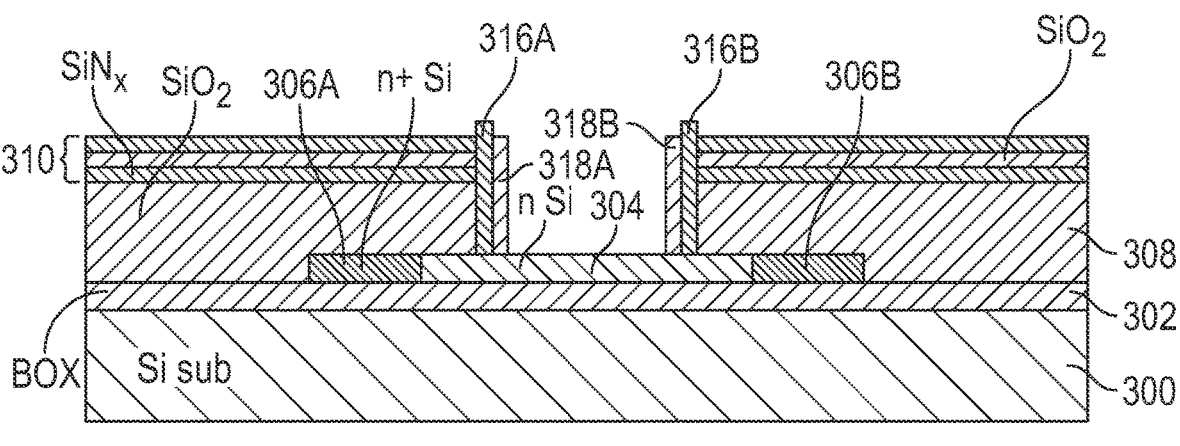
Figure 3H:
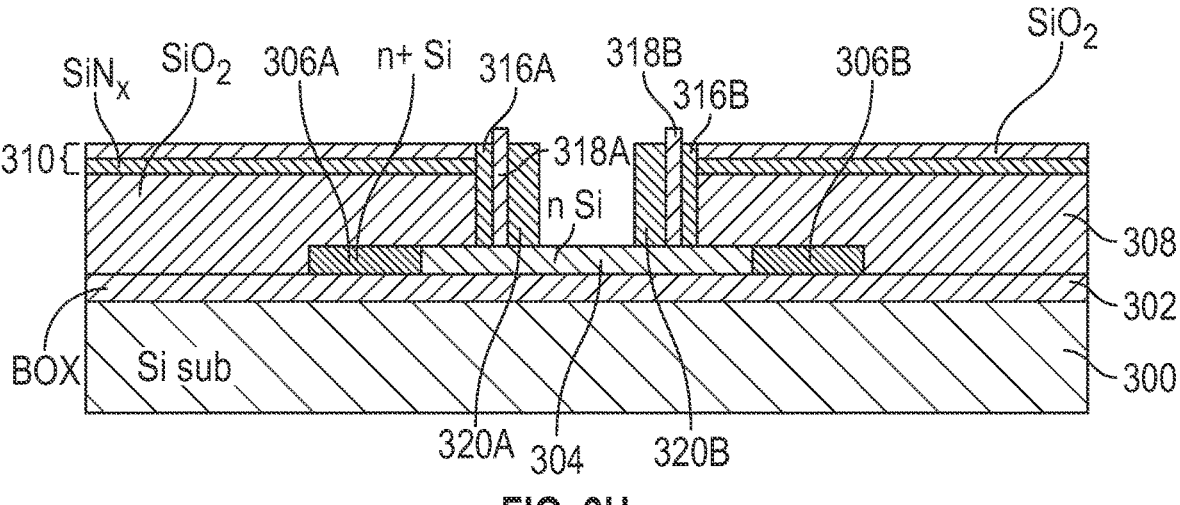
Figure 3I:
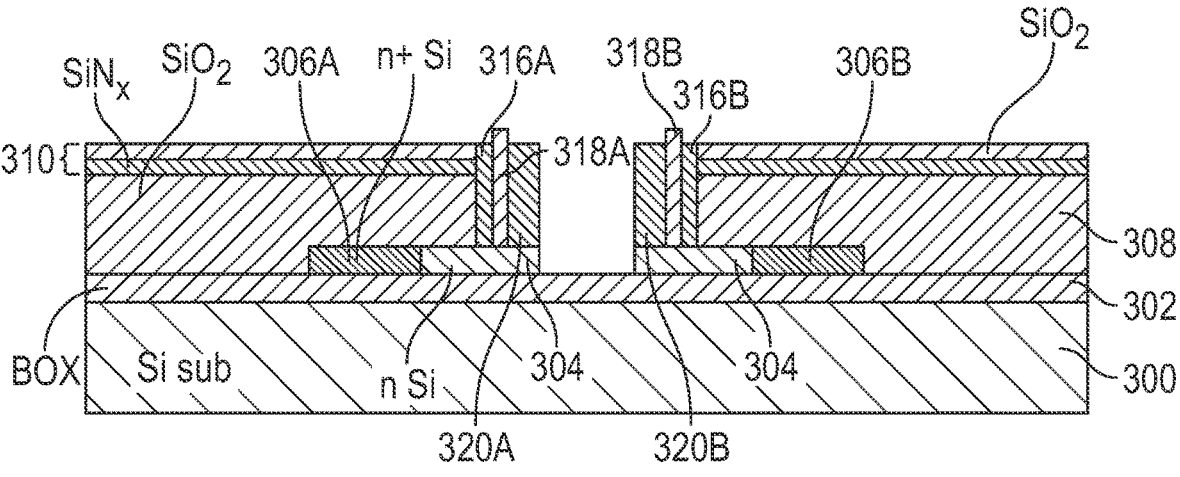
Figure 3J:
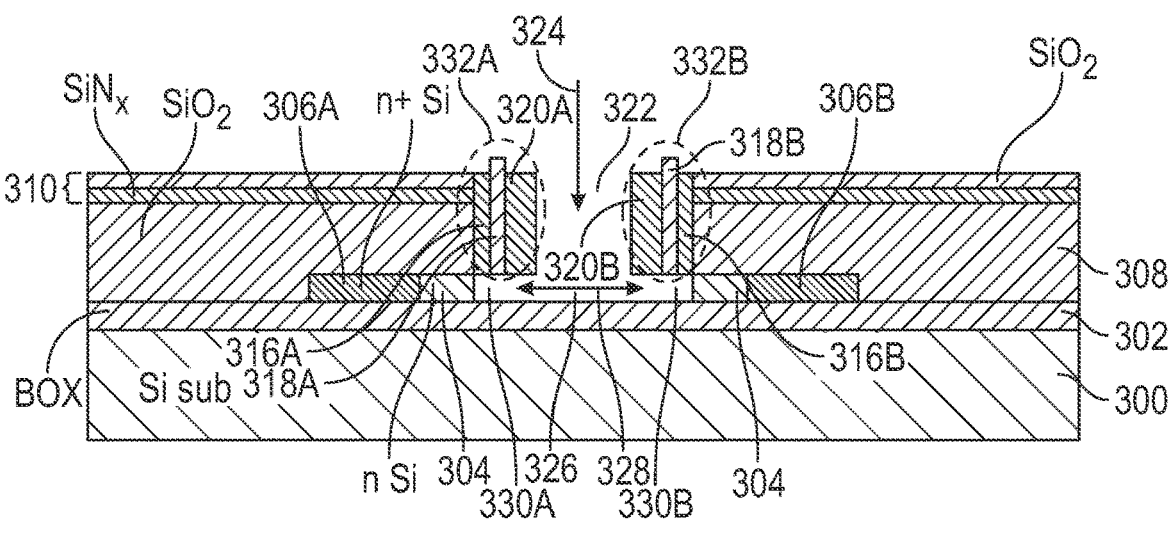
Figure 3K:
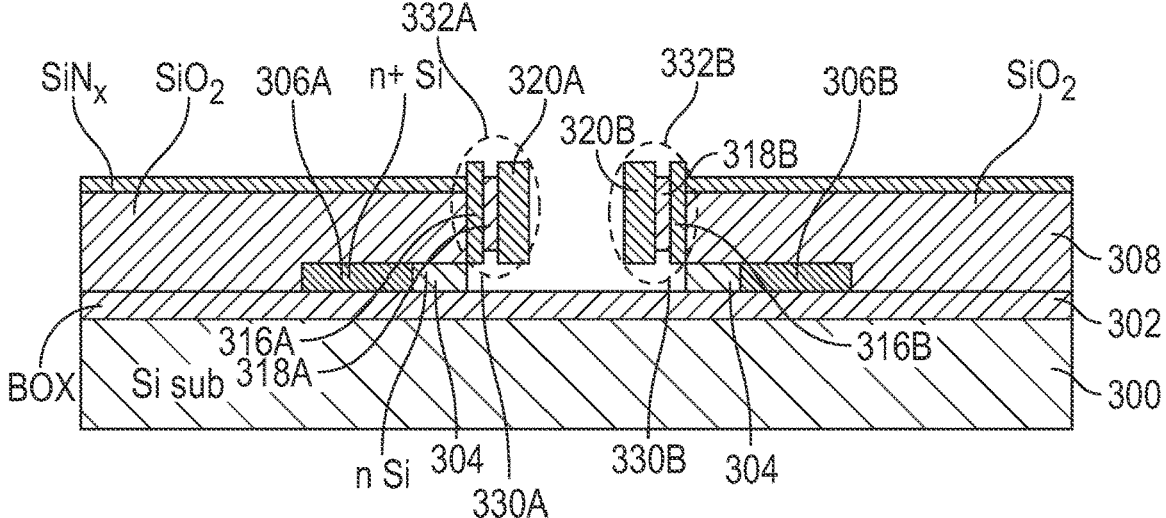
Figure 3L:
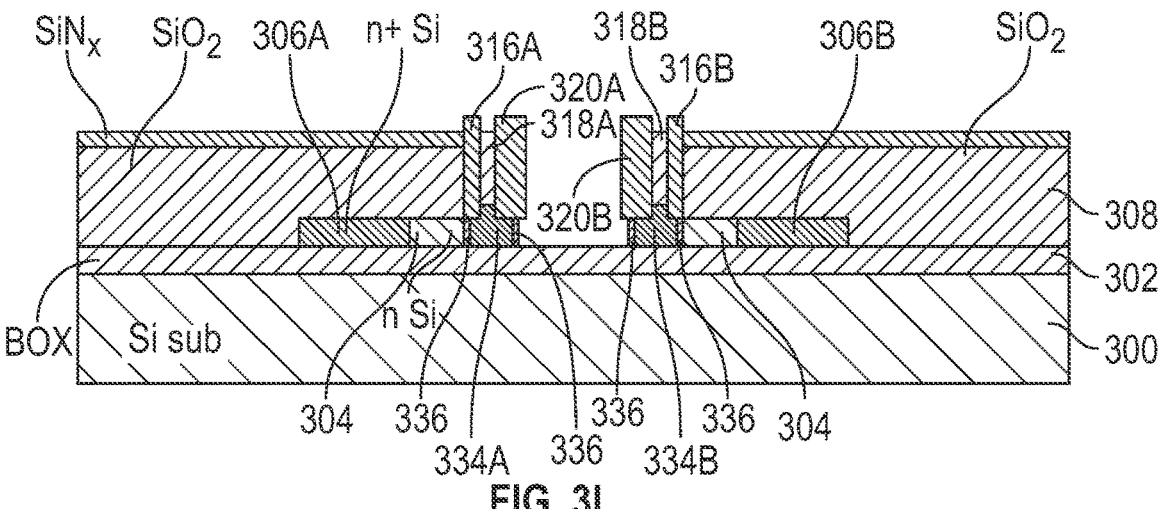
Figure 3M:
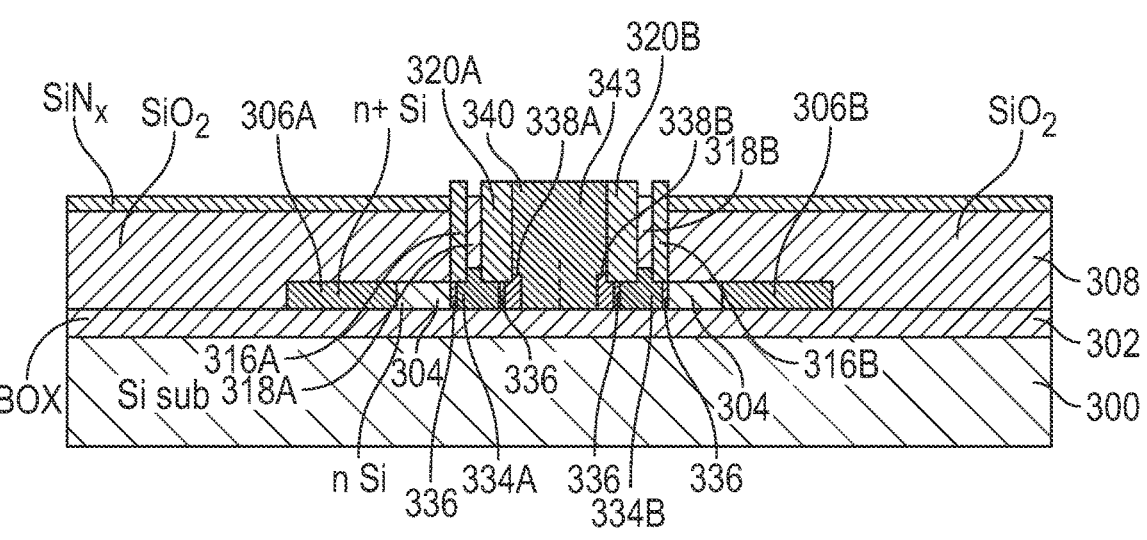
Figure 3N:
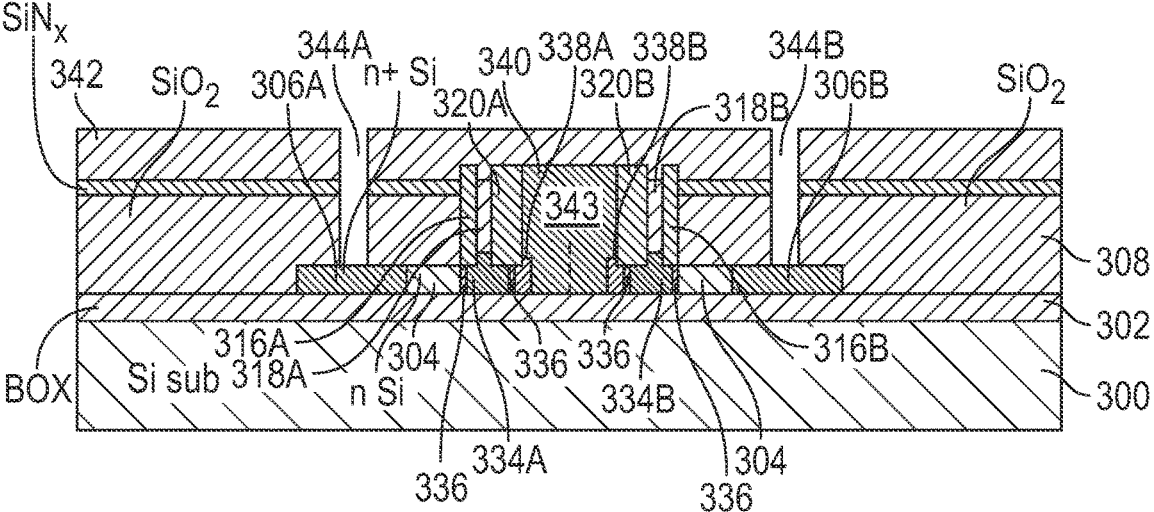
Figure 3O:
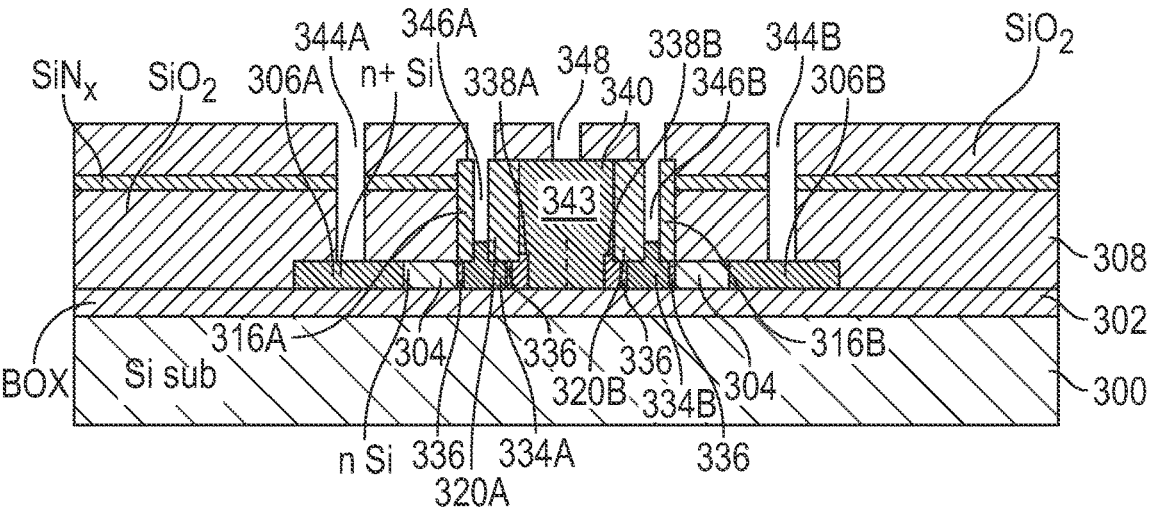
Figure 3P:
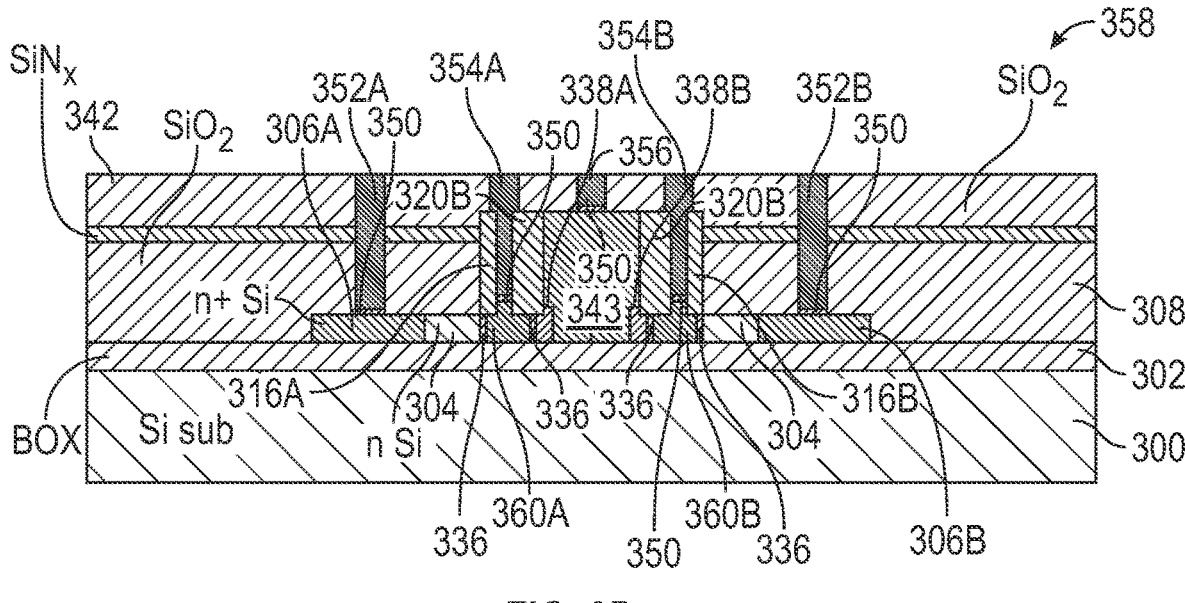

FIGS. 3A-3P depict another example of a process flow for fabricating a lateral heterojunction bipolar transistor device, in accordance with this disclosure. FIGS. 3A-3P depict the fabrication of a high-performance lateral silicon germanium (SiGe) HBT. The process can use SiGe epitaxy to implement a laterally graded SiGe base profile to increase fT and fMax.

The structure shown in FIG. 3A includes a substrate 300, such as silicon. A buried oxide (BOX) layer 302 is formed over the substrate 300. A silicon-on-insulator (SOI) layer 304 is formed over the substrate 300, such as having an n-type Si layer having a first doping concentration. A first collector 306A and a second collector 306B can be formed, e.g., by implantation, using n+Si having a second concentration higher than the first concentration.

In FIG. 3B, a portion of the n-type SOI layer 304 can be removed, e.g., by etching, stopping on the buried oxide layer 302. Then, a layer 308 of oxide can be formed over the substrate, e.g., deposited. Shallow trench isolation can be used.

In FIG. 3C, alternating layers 310 of dielectrics silicon nitride (SiN$_x$) and silicon oxide (SiO$_2$) are deposited. These layers 310 are etch stops.

In FIG. 3D, after a layer of resist is applied, a portion of the layers 310 are removed, e.g., etched, to form the emitter opening 312.

In FIG. 3E, a nitride layer 314 is formed over the emitter opening 312 and over the layers 310.

In FIG. 3F, a portion of the nitride layer 314 is removed, e.g., anisotropically etched using oxide in field as etch stop, so as to leave the spacers 316A, 316B.

In FIG. 3G, a layer of oxide is formed and anisotropically etched adjacent the spacers 316A, 316B, leaving a first layer 318A of oxide and a second layer 318B of oxide. One layer of the layers 310 is removed in the process using one of the nitride layers of the layers 310 as the etch stop.

In FIG. 3H, a layer of nitride is formed and anisotropically etched adjacent the spacers 318A, 318B, leaving a first layer 320A of nitride and a second layer 320B of nitride. One layer of the layers 310 is removed in the process using an oxide layer as the etch stop. The layers 316A, 318A, and 320A form a first side wall and the layers 316B, 318B, and 320B form a second side wall.

The layers 320A, 320B can be thicker than other side wall layers. Instead of having a CMOS gate, like was used in FIGS. 1A-1I above, FIG. 3H builds layers to form self-aligned base contacts.

In FIG. 3I, a portion of the SOI layer 304 can be removed, such as by an anisotropic Si etch that stops on the oxide layer 302.

In FIG. 3J, a lateral portion of SOI layer 304 is removed, e.g., such as using an isotropic timed Si etch and stopping on the oxide layer 302, to form a first region 322 extending lengthwise in a first direction 324 and a second region 326 extending lengthwise in a second direction 328 perpendicular to the first direction 324. Importantly, the etching removes material and forms a lateral region 330A (a first isotropic undercut region) under the first sidewall 332A and a lateral region 330B (a second isotropic undercut region) under the second sidewall 332B.

In the symmetrical example shown in FIG. 3J, the etching forms a T-shaped region. In configurations that are not symmetrical, such as where only one base and one collector are formed, the etching forms an L-shaped region (half of the T-shape) or a mirror image of the L-shape. More generally, the etching forms the region 322 extending in a first direction 324 and the lateral region 330A (and, if present the lateral region 330B) extending in a second direction 328 that is generally perpendicular to the first direction 324. The lateral regions 330A, 330B undercut (e.g., extend under) a portion of at least one layer, such as a portion of the first sidewall 332A and the second first sidewall 332B.

In FIG. 3K, a silicon wet pre-clean with hydrofluoric acid last is performed, which partially etches the oxide from between the two vertical nitride layers of the first sidewall 332A and the second sidewall 332B. As seen, the oxide layer 318A and the oxide layer 318B are recessed from both the bottom and top.

In FIG. 3L, a base is laterally formed in the lateral region 330A and the lateral region 330B. For example, SiGe can be laterally grown to form a thin base layer. The lateral formation results in a doped first region 334A and a doped second region 334B with undoped spacers 336 adjacent the sides of the doped first region 334A and the doped second region 334B. The doped first region 334A and its adjacent doped spacers 336 form a first base and the doped second region

334B and its adjacent doped spacers 336 form a second base. In this manner, they form bases having a first portion with a first doping concentration and a second portion with a second doping concentration.

In FIG. 3M, p-type silicon base cap regions 338A, 338B are formed, e.g., grown, adjacent the doped SiGe spacers 336. In addition, an n+ silicon emitter 340 is formed, e.g., grown. In this manner, an emitter 343 is formed. The dashed line indicates the region where the growth fronts coalesce. Planar growth proceeds after coalescence.

In FIG. 3N, an oxide layer 342 is formed, e.g., deposited. Then, collector contact holes 344A, 344B are formed, e.g., by etching.

In FIG. 3O, base contact holes 346A, 346B are formed through selective etching of silicon dioxide relative to silicon nitride and an emitter contact hole 348 is formed simultaneously.

In FIG. 3P, barrier metal 350, such as titanium/titanium nitride, is deposited in the base contacts holes, the collector contact holes, and the emitter contact hole and followed by a modest temperature cycle to form titanium silicide for low resistance ohmic contacts. Collector contacts 352A, 352B, base contacts 354A, 354B, and emitter contact 356 are formed, such as by depositing and chemical mechanically polishing tungsten, thereby forming an HBT 358.

In an HBT, one or both the emitter and collector junctions can be heterojunctions resulting in different bandgaps. In FIG. 3P, a heterojunction is formed between a collectors and bases. In particular, between the collector 306A and its corresponding base 360A and the collector 306B and its corresponding base 360B. The presence of a larger bandgap material in the collector increases the breakdown voltage of the transistor and therefore provides a wider application space. Also in FIG. 3P, a heterojunction is formed between a base, such as base 360A, and the emitter 343. This heterojunction exponentially improves the injection efficiency of the transistor allowing the base doping to be increased while still achieving high current gain. High base doping is important to lower base resistance and increase $f_{max}$. High base doping also allows the base width to be decreased leading to an increase in $f_T$ through a lower base transit time.

FIG. 4 is a flow diagram of an example of a method 400 for fabricating a lateral heterojunction bipolar transistor device. At block 402, the method 400 can include forming a silicon-on-insulator (SOI) layer over a substrate, such as in FIGS. 1A and 3A.

At block 404, the method 400 can include forming an oxide layer over the SOI layer, such as in FIGS. 1A and 3B.

At block 406, the method 400 can include removing a first portion of the oxide layer and a first portion of the SOI layer to form a first region extending in a first direction and a second region extending in a second direction perpendicular to the first direction, such as FIGS. 1B and 3J.

At block 408, the method 400 can include forming an emitter in the first region, such as in FIGS. 1D and 3M.

At block 410, the method 400 can include laterally forming a base in the second region, such as FIGS. 1C and 3L.

At block 412, the method 400 can include forming a collector adjacent the base, wherein the collector and base are formed from different semiconductor materials having different bandgaps to form a heterojunction, such as in FIGS. 1I and 3L.

At block 414, the method 400 can include removing a second portion of the oxide layer to form a collector contact hole, such as FIGS. 1H and 3N.

At block 416, the method 400 can include forming 1) a collector contact in the collector contact hole, 2) a self-aligned base contact, and 2) an emitter contact, wherein the base contact is not dependent on photolithography alignment tolerances, such as FIGS. 1F, 1I, and 3P.

VARIOUS NOTES

Each of the non-limiting aspects or examples described herein may stand on its own, or may be combined in various permutations or combinations with one or more of the other examples.

The above detailed description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following aspects, the terms "including" and "comprising" are open-ended, that is, a system, device, article, composition, formulation, or process that includes elements in addition to those listed after such a term in an aspect are still deemed to fall within the scope of that aspect. Moreover, in the following aspects, the terms "first," "second," and "third," etc. are used merely as labels, and are not intended to impose numerical requirements on their objects.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the aspects. Also, in the above Detailed Description, various features may be grouped together to streamline the disclosure. This should not be interpreted as intending that an unclaimed disclosed feature is essential to any aspect. Rather, inventive subject matter may lie in less than all features of a particular disclosed embodiment. Thus, the following aspects are hereby incorporated into the Detailed Description as examples or embodiments, with each aspect standing on its own as a separate embodiment, and it is contemplated that such embodiments may be combined with each other in various combinations or permutations. The scope of the invention should be determined with reference to the appended aspects, along with the full scope of equivalents to which such aspects are entitled.

The invention claimed is:

1. A lateral heterojunction bipolar transistor device comprising:
   a buried oxide (BOX) layer formed over a substrate;
   a silicon-on-insulator (SOI) layer formed on the BOX layer;
   an oxide layer formed over the SOI layer;
   a base formed on the BOX layer in a first region;
   a base contact formed in a cavity defined by a nitride spacer and an oxide inside spacer formed over the SOI layer and wherein the base contact is coupled to the base, wherein the base contact is aligned by the relative positions of the nitride spacer and the oxide inside spacer;
   an inverted T-shaped or an L-shaped emitter formed on the BOX layer in a second region; and
   a collector formed on the BOX layer adjacent the base, wherein the collector and base are formed from different semiconductor materials having different bandgaps to form a heterojunction.

2. The lateral heterojunction bipolar transistor device of claim 1, wherein the first region includes an isotropically etched undercut portion of the silicon-on-insulator (SOI) layer.

3. The lateral heterojunction bipolar transistor device of claim 1, wherein the SOI layer includes a first doped region with a first doping concentration and a second doped region with a second doping concentration.

4. The lateral heterojunction bipolar transistor device of claim 1, wherein the collector includes a first doping concentration.

5. The lateral heterojunction bipolar transistor device of claim 1, wherein the base includes a semiconductor material with a bandgap less than silicon.

6. The lateral heterojunction bipolar transistor device of claim 5, wherein the semiconductor material includes silicon germanium.

7. The lateral heterojunction bipolar transistor device of claim 5, wherein the semiconductor material includes silicon germanium tin.

8. The lateral heterojunction bipolar transistor device of claim 1, wherein the base includes a first portion with a first doping concentration and a second portion with a second doping concentration.

9. The lateral heterojunction bipolar transistor device of claim 1, wherein the emitter includes a first portion with a first doping concentration and a second portion with a second doping concentration.

10. A method for fabricating a lateral heterojunction bipolar transistor device, the method comprising:

forming a buried oxide (BOX) layer over a substrate;

forming a silicon-on-insulator (SOI) layer on the BOX layer;

forming an oxide layer over some portion of the SOI layer;

forming at least one gate over some other portion of the SOI layer;

removing a first portion of the oxide layer and a first portion of the SOI layer to form a first opening;

removing a second portion of the SOI layer from underneath the at least one gate to form a second opening between the at least one gate and the BOX layer;

forming either an inverted T-shaped or an L-shaped emitter in the first opening;

laterally forming a base in the second opening;

forming a collector adjacent the base, wherein the collector and base are formed from different semiconductor materials having different bandgaps to form a heterojunction;

removing a second portion of the oxide layer to form a collector contact hole; and forming 1) a collector contact in the collector contact hole, 2) a self-aligned base contact, and 2) an emitter contact, wherein the base contact is not dependent on photolithography alignment tolerances.

11. The method of claim 10, wherein forming the SOI layer over the substrate comprises:

forming a first doped region with a first doping concentration and a second doped region with a second doping concentration.

12. The method of claim 10, comprising:

forming a collector using a material with a first doping concentration.

13. The method of claim 12, wherein forming the collector includes growing the collector.

14. The method of claim 10, wherein forming the emitter in the first opening comprises:

forming a first portion with a first doping concentration and a second portion with a second doping concentration.

15. The method of claim 10, wherein laterally forming the base in the second opening comprises:

laterally growing the base using a semiconductor material with a bandgap less than silicon.

16. The method of claim 15, wherein the semiconductor material includes silicon germanium.

17. The method of claim 15, wherein the semiconductor material includes silicon germanium tin.

18. The method of claim 10, wherein forming the base in the second opening comprises:

forming a first portion with a first doping concentration and a second portion with a second doping concentration.

19. The method of claim 10, comprising:

forming a first replacement gate region over the SOI layer.

20. The method of claim 19, wherein forming the base contact comprises:

removing a portion of the first replacement gate region until reaching the base to form a base contact region; and forming the base contact in the base contact region.

21. A lateral heterojunction bipolar transistor device comprising:

a buried oxide (BOX) layer formed over a substrate;

a silicon-on-insulator (SOI) layer formed on the BOX layer;

an oxide layer formed over the SOI layer;

a base formed on the BOX layer in a first region;

a base contact formed in a cavity defined by a nitride spacer and an oxide inside spacer formed over the SOI layer and wherein the base contact is coupled to the base, wherein the base contact is aligned by the relative positions of the nitride spacer and the oxide inside spacer, wherein the base includes a semiconductor material with a bandgap less than silicon; and an inverted T-shaped or an L-shaped emitter formed on the BOX layer in a second region; and a collector formed on the BOX layer adjacent the base, wherein the collector and base are formed from different semiconductor materials having different bandgaps to form a heterojunction.

22. The lateral heterojunction bipolar transistor device of claim 21, further comprising:

wherein the first region includes an isotropically etched undercut portion of the silicon-on-insulator (SOI) layer.

* * * * *